(12) United States Patent
Ho et al.

(10) Patent No.: US 9,735,043 B2
(45) Date of Patent: Aug. 15, 2017

(54) SEMICONDUCTOR PACKAGING STRUCTURE AND PROCESS

(71) Applicant: Taiwan Semiconductor Manufacturing Company, Ltd., Hsin-Chu (TW)

(72) Inventors: Kuan-Lin Ho, Hsin-Chu (TW); Chin-Liang Chen, Kaohsiung (TW); Wei-Ting Lin, Taipei (TW); Yu-Chih Liu, Taipei (TW); Shih-Yen Lin, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/137,478

(22) Filed: Dec. 20, 2013

(65) Prior Publication Data

US 2015/0179607 A1    Jun. 25, 2015

(51) Int. Cl.
*H01L 21/48* (2006.01)
*H01L 23/34* (2006.01)
(Continued)

(52) U.S. Cl.
CPC ...... *H01L 21/76251* (2013.01); *H01L 21/563* (2013.01); *H01L 21/6836* (2013.01); *H01L 23/16* (2013.01); *H01L 23/3675* (2013.01); *H01L 24/29* (2013.01); *H01L 24/73* (2013.01); *H01L 24/83* (2013.01); *H01L 24/92* (2013.01); *H01L 24/97* (2013.01); *H01L 25/0655* (2013.01); *H01L 25/0657* (2013.01); *H01L 21/4871* (2013.01); *H01L 21/4882* (2013.01); *H01L 23/04* (2013.01); *H01L 23/34* (2013.01); *H01L 23/36* (2013.01); *H01L 23/3737* (2013.01); *H01L 23/40* (2013.01); *H01L 23/4012* (2013.01); *H01L 23/42* (2013.01); *H01L 24/13* (2013.01); *H01L 24/16* (2013.01);
(Continued)

(58) Field of Classification Search
CPC ......... H01L 23/34; H01L 23/36; H01L 23/40; H01L 23/42; H01L 21/487; H01L 21/4882; H01L 23/4012; H01L 21/4871
USPC ......................................... 438/122
See application file for complete search history.

(56) References Cited

U.S. PATENT DOCUMENTS 6,111,313 A * 8/2000 Kutlu ..................... H01L 23/36
257/697
6,472,762 B1 * 10/2002 Kutlu ..................... H01L 23/36
257/706

(Continued)

*Primary Examiner* — David Zarneke
(74) *Attorney, Agent, or Firm* — Slater Matsil, LLP

(57) ABSTRACT

A method and structure for packaging a semiconductor device are provided. In an embodiment a first substrate is bonded to a second substrate, which is bonded to a third substrate. A thermal interface material is placed on the second substrate prior to application of an underfill material. A ring can be placed on the thermal interface material, and an underfill material is dispensed between the second substrate and the third substrate. By placing the thermal interface material and ring prior to the underfill material, the underfill material cannot interfere with the interface between the thermal interface material and the second substrate, and the thermal interface material and ring can act as a physical barrier to the underfill material, thereby preventing overflow.

20 Claims, 10 Drawing Sheets

(51) Int. Cl.
*H01L 23/36* (2006.01)
*H01L 23/40* (2006.01)
*H01L 23/42* (2006.01)
*H01L 21/762* (2006.01)
*H01L 23/16* (2006.01)
*H01L 21/56* (2006.01)
*H01L 23/367* (2006.01)
*H01L 21/683* (2006.01)
*H01L 25/065* (2006.01)
*H01L 23/04* (2006.01)
*H01L 23/373* (2006.01)
*H01L 23/00* (2006.01)

(52) U.S. Cl.
CPC .............. *H01L 24/17* (2013.01); *H01L 24/27* (2013.01); *H01L 24/32* (2013.01); *H01L 24/33* (2013.01); *H01L 2221/68327* (2013.01); *H01L 2224/131* (2013.01); *H01L 2224/16145* (2013.01); *H01L 2224/16146* (2013.01); *H01L 2224/16225* (2013.01); *H01L 2224/16235* (2013.01); *H01L 2224/17181* (2013.01); *H01L 2224/26175* (2013.01); *H01L 2224/27312* (2013.01); *H01L 2224/27334* (2013.01); *H01L 2224/2929* (2013.01); *H01L 2224/29109* (2013.01); *H01L 2224/29124* (2013.01); *H01L 2224/29139* (2013.01); *H01L 2224/29147* (2013.01); *H01L 2224/29155* (2013.01); *H01L 2224/29191* (2013.01); *H01L 2224/29291* (2013.01); *H01L 2224/29324* (2013.01); *H01L 2224/29339* (2013.01); *H01L 2224/29355* (2013.01); *H01L 2224/29387* (2013.01); *H01L 2224/32145* (2013.01); *H01L 2224/32225* (2013.01); *H01L 2224/32237* (2013.01); *H01L 2224/32245* (2013.01); *H01L 2224/32257* (2013.01); *H01L 2224/33181* (2013.01); *H01L 2224/73204* (2013.01); *H01L 2224/73253* (2013.01); *H01L 2224/8321* (2013.01); *H01L 2224/83104* (2013.01); *H01L 2224/83424* (2013.01); *H01L 2224/83447* (2013.01); *H01L 2224/83493* (2013.01); *H01L 2224/83862* (2013.01); *H01L 2224/92122* (2013.01); *H01L 2224/92125* (2013.01); *H01L 2224/97* (2013.01); *H01L 2924/15311* (2013.01); *H01L 2924/1616* (2013.01); *H01L 2924/1631* (2013.01); *H01L 2924/16195* (2013.01); *H01L 2924/16315* (2013.01)

(56) References Cited

U.S. PATENT DOCUMENTS

| | | | |
|---|---|---|---|
| 6,773,963 B2* | 8/2004 | Houle | H01L 23/3128 257/707 |
| 7,459,782 B1* | 12/2008 | Li | H01L 23/36 257/678 |
| 7,585,702 B1* | 9/2009 | Wang | H01L 21/50 257/706 |
| 7,781,883 B2* | 8/2010 | Sri-Jayantha | H01L 23/10 257/704 |
| 7,968,999 B2* | 6/2011 | Celik | H01L 23/10 257/707 |
| 8,021,925 B2* | 9/2011 | Edwards | H01L 23/04 257/704 |
| 8,288,205 B2* | 10/2012 | Shim | 438/109 |
| 8,299,608 B2 | 10/2012 | Bartley et al. | |
| 9,070,656 B2* | 6/2015 | Hooper | H01L 23/36 |
| 9,502,383 B2* | 11/2016 | Wang | H01L 25/0657 |
| 2003/0134454 A1 | 7/2003 | Houle | |
| 2003/0209801 A1* | 11/2003 | Hua | H01L 23/36 257/707 |
| 2005/0127489 A1* | 6/2005 | Mallik | H01L 23/04 257/686 |
| 2005/0256241 A1* | 11/2005 | Sachdev | C08K 3/08 524/439 |
| 2006/0209514 A1* | 9/2006 | Katoh | H01L 21/563 361/705 |
| 2007/0164424 A1* | 7/2007 | Dean | H01L 23/42 257/707 |
| 2008/0001282 A1* | 1/2008 | Modi | H01L 21/563 257/710 |
| 2010/0019377 A1* | 1/2010 | Arvelo | H01L 21/563 257/712 |
| 2010/0044856 A1* | 2/2010 | Sri-Jayantha | H01L 23/10 257/717 |
| 2011/0042784 A1* | 2/2011 | Edwards | H01L 21/563 257/532 |
| 2011/0180923 A1* | 7/2011 | Humenik | H01L 23/42 257/704 |
| 2012/0049339 A1* | 3/2012 | Wang | H01L 21/563 257/693 |

* cited by examiner

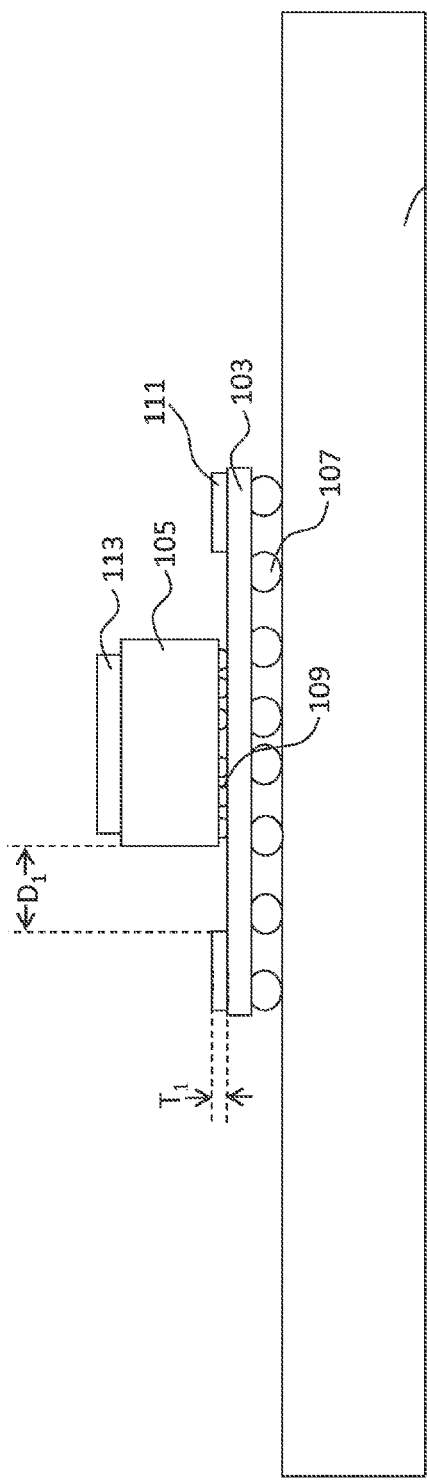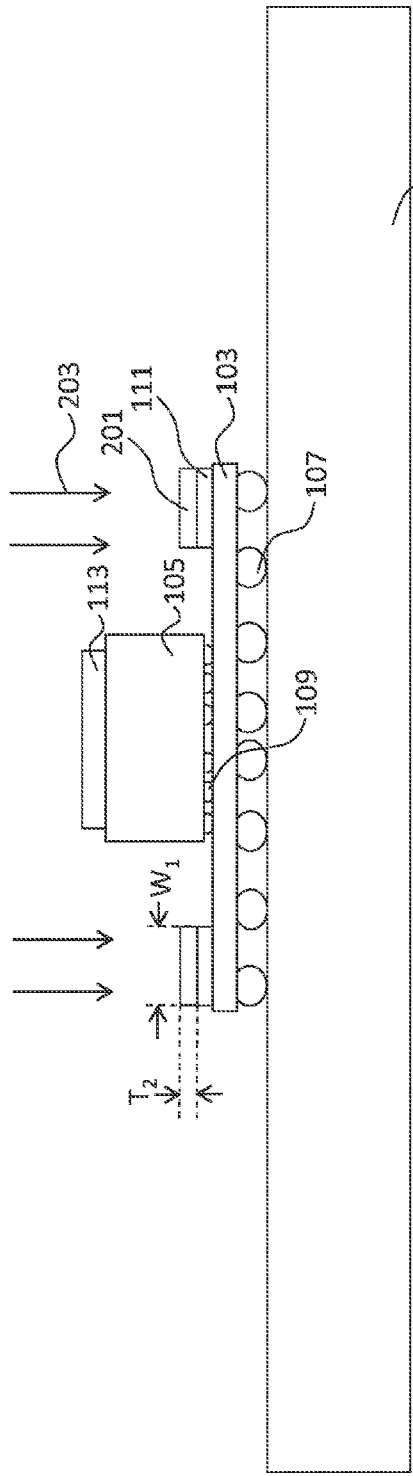

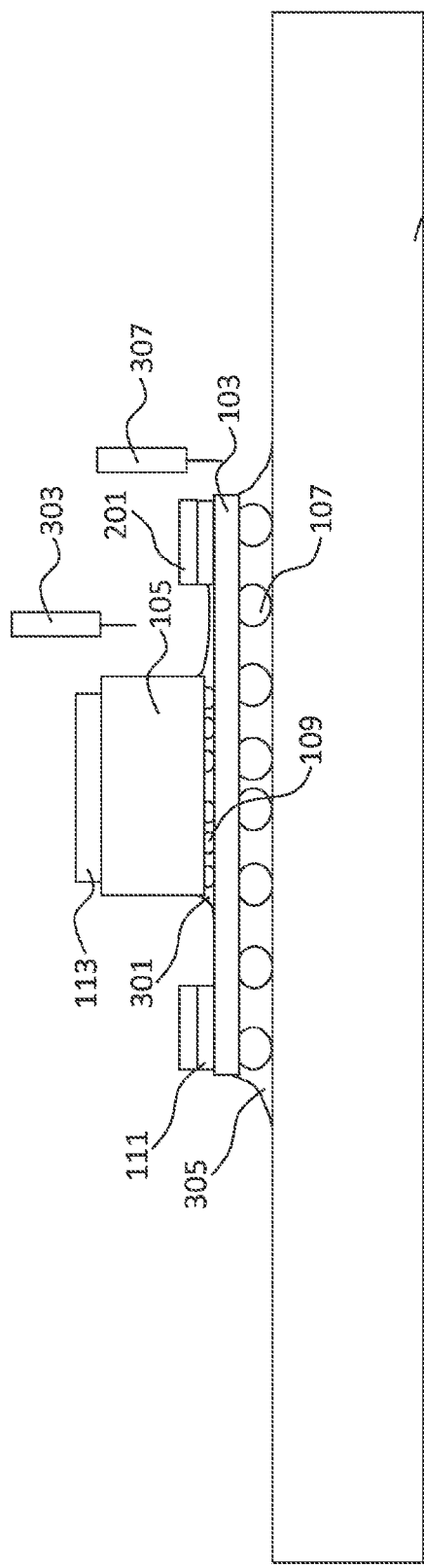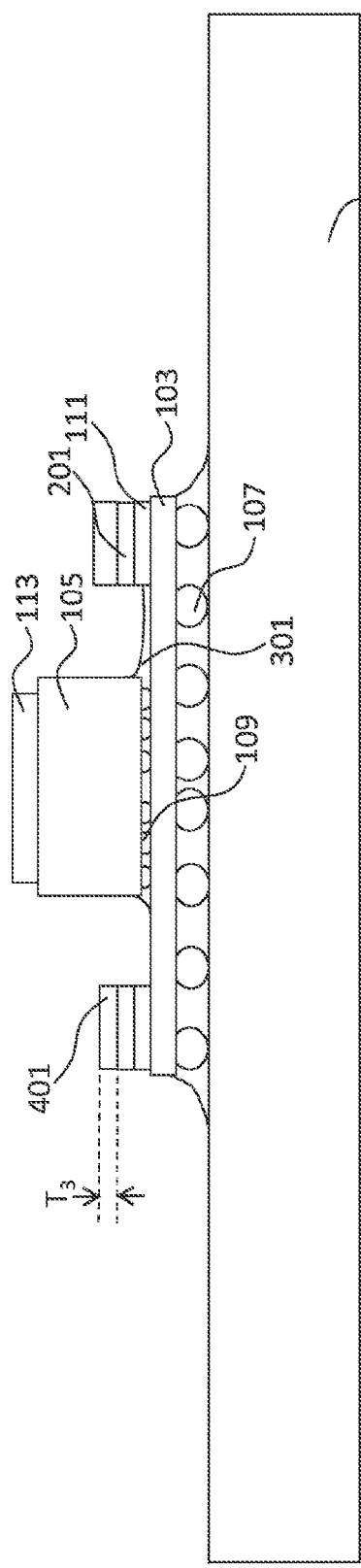

SEMICONDUCTOR PACKAGING STRUCTURE AND PROCESS

TECHNICAL FIELD

The present invention relates generally to a system and method for packaging semiconductor devices, and, in particular embodiments, to a system and method for packaging semiconductor devices using a ring and/or interface material.

BACKGROUND

The continuous growth of the semiconductor industry is due in no small part to the constant improvements in the integration density of electronic components (i.e., transistors, diodes, resistors, capacitors, etc.) by reducing their physical sizes to allow for a greater number of components to be placed in a given chip area. Some improvements are two-dimensional (2D) in nature in that the devices are fabricated on the surface of a semiconductor wafer. And even though advancements in lithography have enabled each new technology generation to feature smaller sizes than the previous one, there is an eventual physical limitation to the minimum size needed to make these components function properly. Additionally, when more devices are placed in one chip, the design complexity also increases.

One solution to solving the problems discussed above is to stack dies on top of one another and interconnect or route them through connections such as through-silicon vias (TSVs). Such a configuration is named a three-dimensional integrated circuit (3DIC). Some of the benefits of 3DIC, for example, include exhibiting a smaller footprint, reducing power consumption by reducing the lengths of signal interconnects, and improving yield and fabrication cost if individual dies are tested separately prior to assembly.

A typical problem with three-dimensional integrated circuit is heat dissipation during operation. A prolonged exposure of a die by operating at excessive temperatures may decrease the reliability and operating lifetime of the die. This problem may become severe if the die is a computing die such as a central processing unit (CPU), which generates a lot of heat. As such, improvements to heat transfer are still needed.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 illustrates a first substrate, a second substrate, and a third substrate with a thermal interface material on the second substrate in accordance with an embodiment;

FIGS. 2A-2B illustrates an application of a ring on the thermal interface material in accordance with an embodiment;

FIG. 3 illustrates an application of underfill material in accordance with an embodiment;

FIG. 4 illustrates an application of a thermal interface material on the ring in accordance with an embodiment;

Figure 2B:
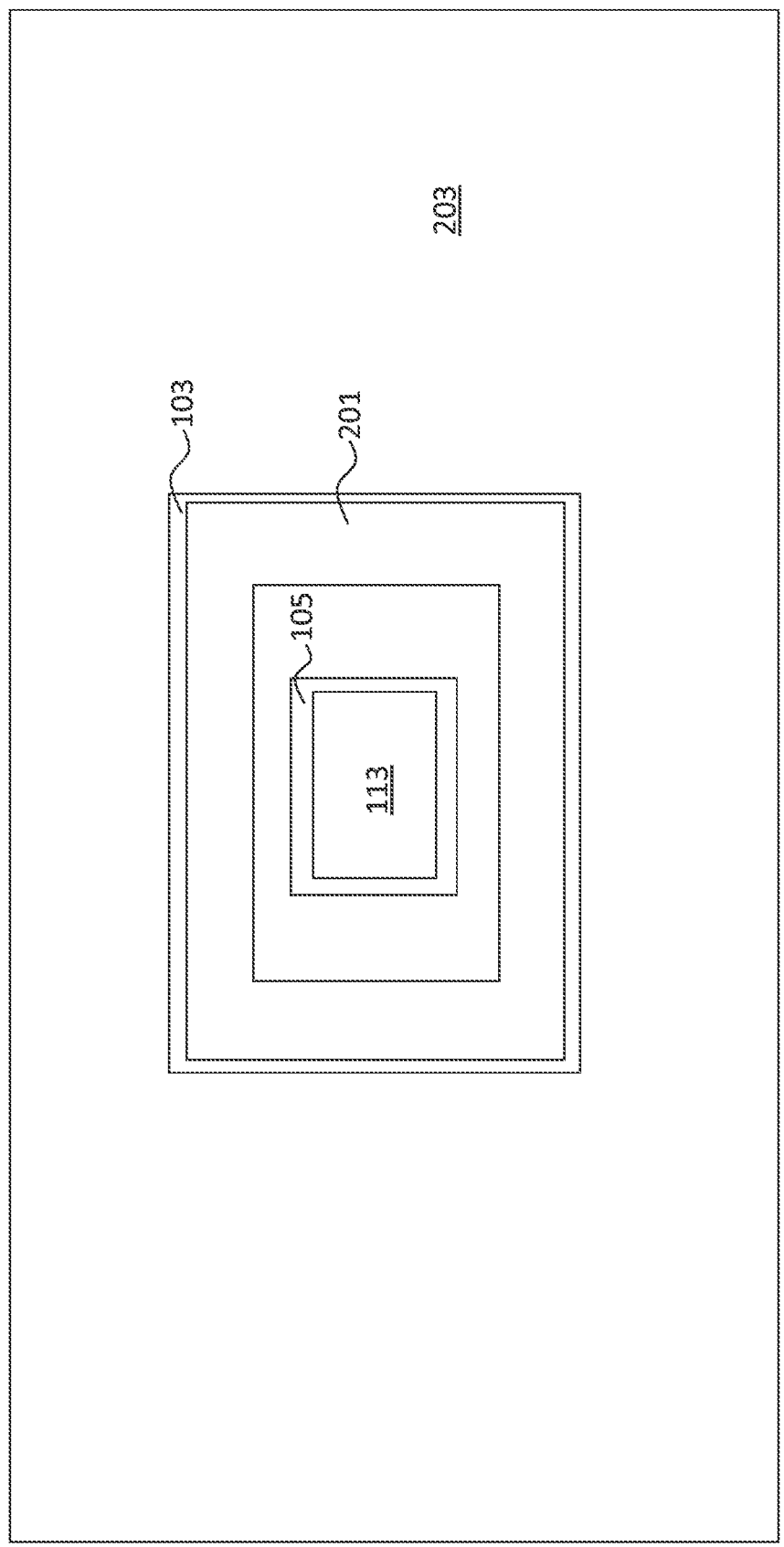

Corresponding numerals and symbols in the different figures generally refer to corresponding parts unless otherwise indicated. The figures are drawn to clearly illustrate the relevant aspects of the embodiments and are not necessarily drawn to scale. Furthermore, dashed outlines depict regions where a layer or a component of the package is beneath or behind another layer or component.

DETAILED DESCRIPTION OF ILLUSTRATIVE EMBODIMENTS

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the disclosure.

With reference now to FIG. 1, FIG. 1 illustrates a first substrate 101 bonded to a second substrate 103, which is also bonded to a third substrate 105. The first substrate 101 may provide a structural base and an electrical interface from the second substrate 103 and/or the third substrate 105 to other devices and systems (not individually illustrated in FIG. 1). In an embodiment the first substrate 101 may be, e.g., a printed circuit board that works to interconnect various electrical components to each other in order to provide a desired functionality for a user.

Alternatively, the first substrate 101 may be another substrate and comprises multiple conductive layers (not individually illustrated), some of which are inter-layers within the first substrate 101. These layers may be etched into traces of various widths and lengths and connected through inter-layer vias. Together, the lines and vias may form an electrical network to route DC power, ground, and signals from one side of the first substrate 101 to the other. Those of skill in the art will recognize the first substrate 101 may be fabricated from an organic (laminate) material such as bismaleimide-triazine (BT), a polymer-based material such as liquid-crystal polymer (LCP), a ceramic material such as low-temperature co-fired ceramic (LTCC), a silicon or glass interposer, or the like. Those of skill in the art will also recognize the conductive layers and vias may be formed from any suitable conductive material, such as copper, aluminum, silver, gold, other metals, alloys, combination thereof, and/or the like, and formed by any suitable technique, such as electro-chemical plating (ECP), electroless plating, other deposition methods such as sputtering, printing, and chemical vapor deposition (CVD) methods, or the like.

In some embodiments, the first substrate 101 may include electrical elements, such as resistors, capacitors, signal distribution circuitry, combinations of these, or the like. These electrical elements may be active, passive, or a combination thereof. In other embodiments, the first substrate 101 is free from both active and passive electrical elements therein. All such combinations are fully intended to be included within the scope of the embodiments.

The second substrate 103 may be bonded both electrically and physically to the first substrate 101. In an embodiment the second substrate 103 may be a mother chip and may comprise a first semiconductor die such as a logic die/interposer that comprises a number of structures (not individually illustrated in FIG. 1) such as a substrate formed from a variety of semiconductor substrate materials such as silicon (Si), silicon carbide (SiC), gallium arsenide (GaAs), gallium nitride (GaN), or the like. A combination of active and/or passive devices, such as transistors, diodes, resistors, capacitors, and the like, may be formed as part of the second substrate 103 to construct functional circuitries. In addition, alternating layers of conductive materials (such as copper, aluminum, alloys, doped polysilicon, combinations thereof, or the like) may be utilized between layers of dielectric material to form interconnections between the active and passive devices and also to provide access to first external connections 107. Through substrate vias (TSVs—not separately illustrated in FIG. 1) may also be formed in order to provide electrical connectivity from one side of the second substrate 103 to another side of the second substrate 103.

In an embodiment the second substrate 103 is bonded to the first substrate 101 using the first external connections 107, which may be, e.g., solder balls, in a flip-chip configuration. The first external connections 107 provide electrical and thermal connections between the second substrate 103 and the first substrate 101. However, alternative methods of electrically and physically attaching the second substrate 103 to the first substrate 101, such as C4 bumps, microbumps, pillars, columns, or other structures formed from a conductive material such as solder, metal, or metal alloy, may be utilized to facilitate electrical, physical, and thermal connectivity between the second substrate 103 and the first substrate 101.

The third substrate 105 may be similar to the second substrate 103, such as by being semiconductor stacked dies such as memory, flash, converter, sensor, logic die and so on that can work in conjunction with the second substrate 103 in order to provide a desired functionality to the user. In a particular embodiment the third substrate 105 may be considered a daughter substrate (to the second substrate's 103 mother substrate) and comprises a number of structures (not individually illustrated in FIG. 1) such as a substrate formed from a variety of semiconductor substrate materials such as silicon (Si), silicon carbide (SiC), gallium arsenide (GaAs), gallium nitride (GaN), or the like. A combination of active and/or passive devices, such as transistors, diodes, resistors, capacitors, and the like, may be formed as part of the third substrate 105 to construct functional circuitries. In addition, alternating layers of conductive materials (such as copper, aluminum, alloys, doped polysilicon, combinations thereof, or the like) may be utilized between layers of dielectric material to form interconnections between the active and passive devices and also to provide access to second external connections 109.

In an embodiment the third substrate 105 is bonded to the second substrate 103 using the second external connections 109, which may be, e.g., solder balls, in a flip-chip configuration. The second external connections 109 provide electrical and thermal connections between the third substrate 105 and the second substrate 103. However, alternative methods of electrically and physically attaching the third substrate 105 to the second substrate 103, such as C4 bumps, micro-bumps, pillars, columns, or other structures formed from a conductive material such as solder, metal, or metal alloy, may be utilized to facilitate electrical, physical, and thermal connectivity between the third substrate 105 and the second substrate 103.

Alternatively, the third substrate 105 may comprise a plurality of semiconductor dies (not individually illustrated in FIG. 1). In such an embodiment the plurality of semiconductor dies within the third substrate 105 may be interconnected using, e.g., through substrate vias (TSVs). These TSVs may also be used to connect the plurality of semiconductor dies to the second substrate 103, such that power, ground, and electrical signals may be passed to each of the plurality of semiconductor dies.

FIG. 1 also illustrates the application of first thermal interface material 111 to a top surface of the second substrate 103 and the application of second thermal interface material 113 to a top surface of the third substrate 105. In an embodiment the first thermal interface material 111 is placed onto the second substrate 103 prior to any placement of a first underfill material 301 (not illustrated in FIG. 1 but illustrated and described below with respect to FIG. 3) between the second substrate 103 and the third substrate 105. This allows the first thermal interface material 111 to be placed without interference from the first underfill material 301, thereby avoiding any uneven surfaces that may result from the application of the first underfill material 301 and allowing the first thermal interface material 111 to have a large amount of surface area contact with the second substrate 103 and increasing the ability of heat to be transferred from the second substrate 103, through the first thermal interface material 111, and ultimately to a lid 501 (not illustrated in FIG. 1 but illustrated and discussed below with respect to FIG. 5) that may be a heat sink in order to remove heat from the second substrate 103.

In an embodiment the first thermal interface material 111 may be a viscous, silicone compound similar to the mechanical properties of a grease or a gel. The first thermal interface material 111 is used to improve electrical and/or thermal conduction by filling in microscopic air pockets created between minutely uneven surfaces, such as the region between surfaces of the second substrate 103 and overlying materials. In some embodiments the first thermal interface material 111 is a metal-based thermal paste containing silver, nickel, or aluminum particles suspended in the silicone grease. In alternative embodiments non-electrically conductive, ceramic-based pastes, filled with ceramic powders such as beryllium oxide, aluminum nitride, aluminum oxide, or zinc oxide, may be applied.

Alternatively, instead of being a paste with a consistency similar to gels or greases, the first thermal interface material 111 may, instead be a solid material. In this embodiment the first thermal interface material 111 may be a thin sheet of a thermally conductive, solid material. In a particular embodiment the first thermal interface material 111 that is solid may be a thin sheet of indium, nickel, silver, aluminum, combinations and alloys of these, or the like, or other thermally conductive solid material. Any suitably thermally conductive material may alternatively be utilized, and all such materials are fully intended to be included within the scope of the embodiments.

The first thermal interface material 111 is injected or placed on the second substrate 103 around but laterally separated from the third substrate 105. In an embodiment the first thermal interface material 111 has a first thickness $T_1$ of between about 5 µm and about 500 µm, such as about 100 µm. However, any other suitable thickness may alternatively be used. Additionally, the first thermal interface material 111 may be spaced from the third substrate 105 by a first distance $D_1$ of between about 0.1 mm and about 20 mm, such as about 0.5 mm. By placing the first thermal interface material 111 onto the second substrate 103 prior to the first underfill material 301, the thickness of the first thermal interface material 111 (in an embodiment in which it is a non-solid material) can be better controlled because the surface of the second substrate 103 is more even without the presence of the first underfill material 301 at this point in the process.

The second thermal interface material 113 may be placed on a top surface of the third substrate 105 in order to provide a thermal interface between the third substrate 105 and the overlying lid 501. In an embodiment the second thermal interface material 113 may be similar to the first thermal interface material 111 and may be applied at the same time as the first thermal interface material 111, although alternatively the second thermal interface material 113 may be different from the first thermal interface material 111.

FIG. 2A illustrates a placement of a ring 201 on the first thermal interface material 111 and around the third substrate 105. In an embodiment the ring 201 is used to provide both a thermal path from the first thermal interface material 111 to the overlying lid 501 (not illustrated in FIG. 2A but illustrated and described below with respect to FIG. 5) and also to provide a physical blockage during an application of a first underfill material 301 so that the first underfill material 301 cannot overflow to the first substrate 101.

In an embodiment the ring 201 may comprise a thermally conductive material, such as a material having a thermal conductivity of greater than about 1 W/m*k. In a particular embodiment the ring 201 may comprise a metal such as copper, although any other suitable metal, such as aluminum or the like, may also be used. Similarly, dielectric materials, such as silicone, may also be utilized as long as they are suitable for the transmission of heat from the second substrate 103 to the lid 501.

In an embodiment the ring 201 may be placed on the first thermal interface material 111, and, in one embodiment, may have a second thickness $T_2$ of between about 0.05 mm and about 5 mm, such as about 0.2 mm. Similarly, the ring 201 may have a first width $W_1$ of between about 0.1 mm and about 20 mm, such as about 0.5 mm.

In another embodiment, instead of having a single ring 201 that encircles the third substrate 105 on the second substrate 103, multiple rings 201 may be used. In this embodiment a plurality of rings 201 are placed on the first thermal interface material 111, with one ring being within another ring 201. By using multiple rings 201 instead of a single ring, additional support may be provided.

FIG. 2A also illustrates a heat treatment (represented in FIG. 2A by the arrows labeled 203) that may be performed in an embodiment in which the first thermal interface material 111 is in a liquid or semi-solid form. In this embodiment the heat treatment 203 is utilized to cure the first thermal interface material 111 such that the first thermal interface material 111 becomes solid. The heat treatment 203 may be performed by placing the first thermal interface material 111 into e.g., a furnace and heating the first thermal interface material 111 to a temperature of between about 100° C. and about 300° C., for a time period of between about 10 min and about 4 hr.

However, while the curing of the first thermal interface material 111 is performed in the embodiment described above using the heat treatment 203, the curing is not intended to be limited as such. Rather, any suitable method for curing the first thermal interface material 111, such as irradiating the first thermal interface material 111 or even allowing the first thermal interface material 111 to cure at room temperature may also be utilized. All suitable methods for curing the first thermal interface material 111 are fully intended to be included within the scope of the embodiments.

FIG. 2B illustrates a top-down view of the structure in FIG. 2A. As can be seen, the ring 201 and the first thermal interface material 111 (not directly seen in the top-down view of FIG. 2B but present under the ring 201) are laterally separated from the third substrate 105, and also extend to encircle the third substrate 105. As such, the combination of the first thermal interface material 111 and the ring 201 can prevent the first underfill material 301 (not present in FIG. 2B but illustrated and discussed below with respect to FIG. 3) from overflowing in each direction around the third substrate 105.

FIG. 3 illustrates an application of a first underfill material 301 between the second substrate 103 and the third substrate 105. In an embodiment the first underfill material 301 is a silica filled epoxy resin, and may be used to fill the gap space in between the second substrate 103 and the third substrate 105. The first underfill material 301 increases mechanical reliability by distributing stresses across the top surface of the second substrate 103 rather than allowing them to become concentrated in, e.g., the second external connections 109. In addition, the first underfill material 301 provides encapsulation from moisture and contaminants in the external environment.

In an embodiment the first underfill material 301 may be injected into the region between the second substrate 103 and the third substrate 105. In an embodiment the first underfill material 301 is injected using a first nozzle 303 that is moved around the second substrate 103 and the third substrate 105 while the first nozzle 303 injects the first underfill material 301 at relatively high pressure into the region between the second substrate 103 and the third substrate 105.

However, with the presence of the first thermal interface material 111 and the ring 201, the first underfill material 301 is physically blocked from overflowing from the top surface of the second substrate 103 onto the first substrate 101, preventing further damage or inefficiencies due to the first underfill material 301 bleeding or creeping. In particular, the presence of the first thermal interface material 111 and the ring 201 may allow the first underfill material 301 to extend to the first thermal interface material 111 and the ring 201, but does not allow the first underfill material 301 to extend between the first thermal interface material 111 and the second substrate 103. As such, the first underfill material 301 cannot interfere with the interface between the first thermal interface material 111 and the second substrate 103, lower the surface area of contact between the first thermal interface material 111 and the second substrate 103, and thereby interfere with the heat transfer out of the second substrate 103. As such, the first underfill material 301 will not interfere with the heat transfer between the second substrate 103 and the lid 503, thereby improving workability at the heat sink and achieving better thermal dissipation. Additionally, the first thermal interface material 111 will not cause undue stresses on the first underfill material 301 because the first thermal interface material 111 will not be located on top of the first underfill material 301 and will help prevent the first underfill material 301 from cracking.

Similarly, FIG. 3 also illustrates a second underfill material 305 being placed between the first substrate 101 and the second substrate 103. In an embodiment the second underfill material 305 may be similar to the first underfill material 301, such as by being a silica filled epoxy resin, although in other embodiments the second underfill material 305 may be different from the first underfill material 301. The second underfill material 305 may be injected into the region between the second substrate 103 and the first substrate 101. In an embodiment the second underfill material 305 is injected using a second nozzle 307 that is moved around the second substrate 103 and the first substrate 101 while the second nozzle 307 injects the second underfill material 305 at relatively high pressure into the region between the second substrate 103 and the first substrate 101.

FIG. 4 illustrates a placement of a third thermal interface material 401 over the ring 201. In an embodiment the third thermal interface material 401 may be similar to the first thermal interface material 111 and may be used to provide a thermal interface between the ring 201 (and, hence the second substrate 103) and the overlying lid 501. In an embodiment the third thermal interface material 401 may be disposed onto the ring 201 in either a solid, grease, or gel consistency to a third thickness $T_3$ of between about 5 μm and about 500 μm, such as about 100 μm. If the third thermal interface material 401 is disposed as a non-solid, then the third thermal interface material 401 may be cured in order to solidify the third thermal interface material 401.

Figure 5:
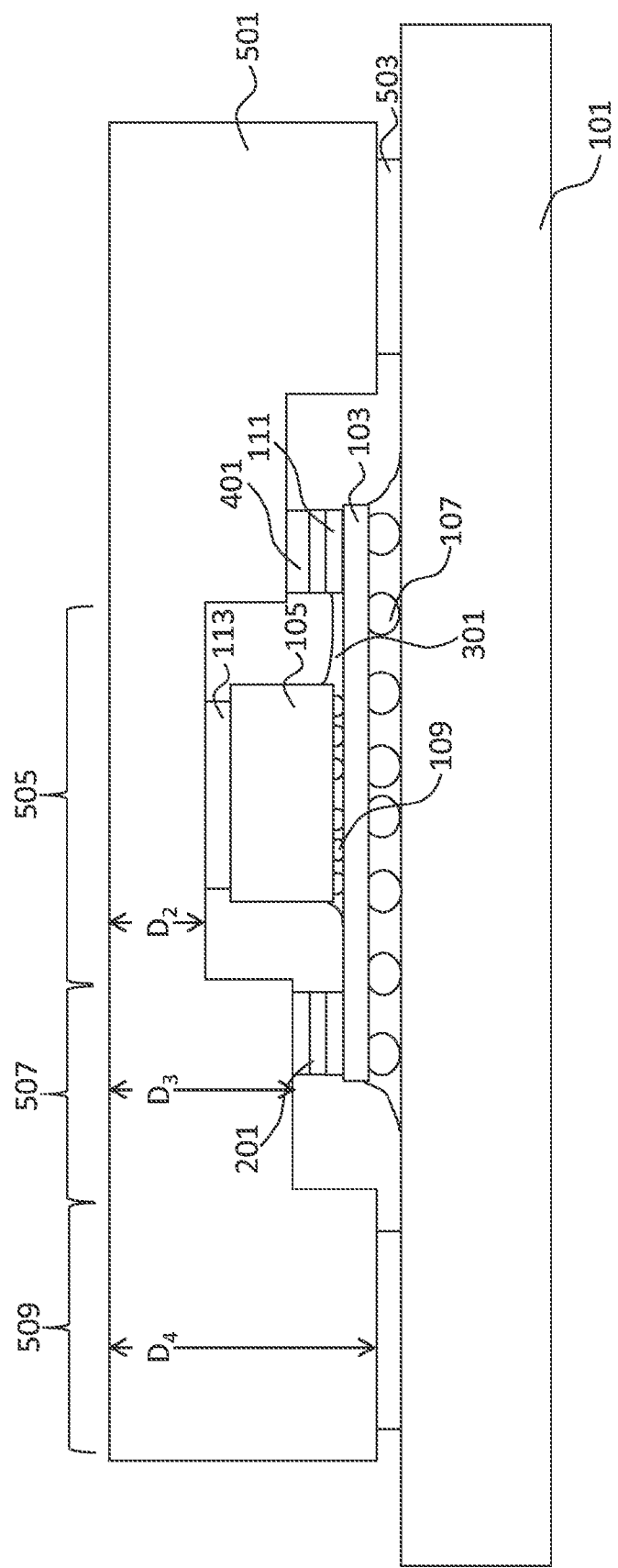
FIG. 5 illustrates an application of a lid in accordance with an embodiment.

FIG. 5 illustrates the placement of a lid 501 over the first substrate 101, the second substrate 103, and the third substrate 105, and in contact with the third thermal interface material 401 and the second thermal interface material 113. In an embodiment the lid 501 is deployed to protect the first substrate 101, the second substrate 103, and the third substrate 105 and also to help spread the heat generated from the second substrate 103 and the third substrate 105 over a larger area, especially for high power applications. In an embodiment the lid 501 may comprise copper, aluminum, other metals, alloys, combinations thereof, or other material of high electrical and thermal conductivities.

Additionally, the lid 501 may also comprise a heat sink (not individually illustrated in FIG. 5). In an embodiment the heat sink may be mounted over and thermally coupled to the third substrate 105 and the second substrate 103. The heat sink may be formed using materials exhibiting high thermal conductivity such as aluminum, copper, diamond, other metals, alloys, combinations thereof, and the like, and aids in the cooling of the second substrate 103 and the third substrate 105 by increasing a given surface area to be exposed to a cooling agent surrounding it such as air. The heat transfer mechanisms occur through the convection of the surrounding air, the conduction through the air, and radiation. For example, the heat sink may exhibit a much greater surface area for convection compared with the surface area of the second substrate 103 and the third substrate 105 by employing a large number of fins in the form of a matrix of geometrically shaped pins or an array of straight or flared fins. In another example, such as where convection is low, a matted-black surface color may radiate much more efficiently than shiny, metallic colors in the visible spectrum. Any suitable form for the heat sink may alternatively be utilized.

In an embodiment the lid 501 has a first region 505 that is physically in contact with the second thermal interface material 113, a second region 507 that is physically in contact with the third thermal interface material 401, and a third region 509 in connection with the first substrate 101 through, e.g., an adhesive material 503. The adhesive material 503 may be, e.g., a thermally conductive adhesive or other material that physically bonds or attaches the lid 501 to the first substrate 101. To account for the differences in heights between the first substrate 101, the combination of the first substrate 101 and the second substrate 103, and the combination of the first substrate 101, the second substrate 103, and the third substrate 105, the first region 505 of the lid 501 may extend a second distance $D_2$ of between about 0.1 mm and about 5 mm, such as about 1 mm, the second region may extend a third distance $D_3$ of between about 0.15 mm and about 10 mm, such as about 1.5 mm, and the third region may extend a fourth distance $D_4$ of between about 0.2 mm and about 15 mm, such as about 2 mm.

Figure 6:
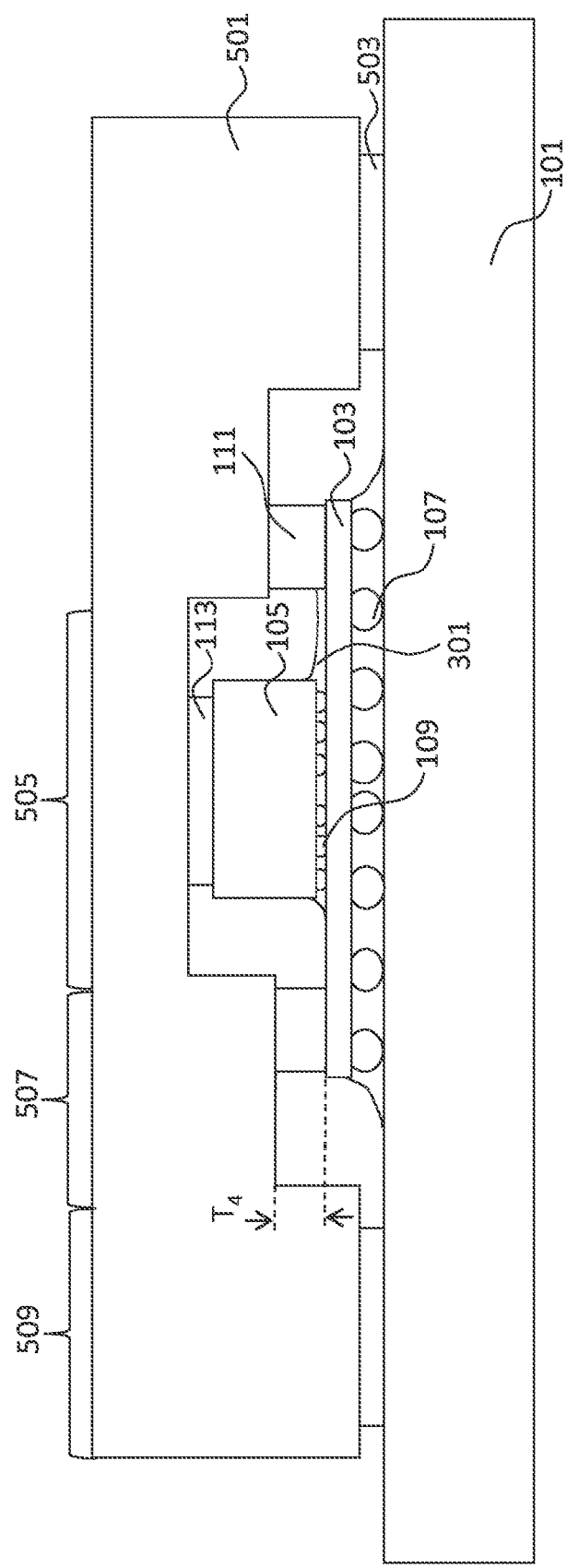
FIG. 6 illustrates another embodiment in which the thermal interface material is utilized without a ring in accordance with an embodiment.

FIG. 6 illustrates another embodiment in which the ring 201 is not included. Rather, the thickness of the first thermal interface material 111 is expanded such that it has a fourth thickness $T_4$ that is enough to contact both the lid 501 in the second region 507 as well as the second substrate 103. In an embodiment the fourth thickness $T_4$ may be between about 5 μm and about 1500 μm, such as about 200 μm. By removing the ring 201 and the third thermal interface material 401, but by maintaining the placement of the first thermal interface material 111 prior to the placement of the first underfill material 301, the overall manufacturing process may be simplified while still maintaining the ability of the first thermal interface material 111 to block the movement of the first underfill material 301 and prevent the first underfill material 301 from interfering with the surface area of the interface between the first thermal interface material 111 and the second substrate 103.

Figure 7:
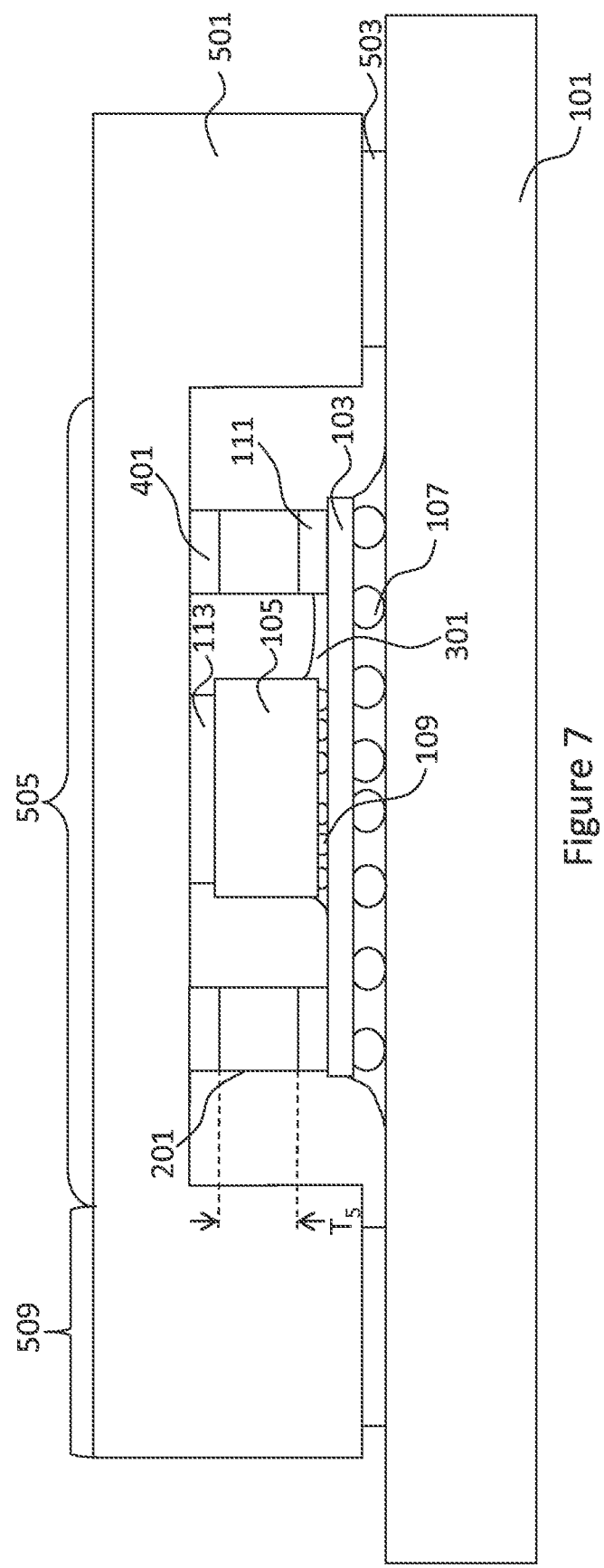
FIG. 7 illustrates another embodiment with a lid that has two regions in accordance with an embodiment.

FIG. 7 illustrates yet another embodiment in which the second region 507 (see FIG. 5) is removed from the lid 501, leaving only the first region 505 of the lid 501 in physical contact with the second thermal interface material 113 and the third region 509 of the lid 501 in contact with the adhesive material 503 on the first substrate 101. In this embodiment the ring 201 is expanded to have a fifth thickness $T_5$ such that the combination of the first thermal interface material 111, the ring 201, and the third thermal interface material 401 extends to form a physical and thermal pathway between the second substrate 103 and the first region 505 of the lid 501. In a particular embodiment the fifth thickness $T_5$ is between about 0.05 mm and about 5 mm, such as about 1 mm, while the first thermal interface material 111 and the third thermal interface material 401 may have the first thickness $T_1$ and the third thickness $T_3$, respectively.

Figure 8:
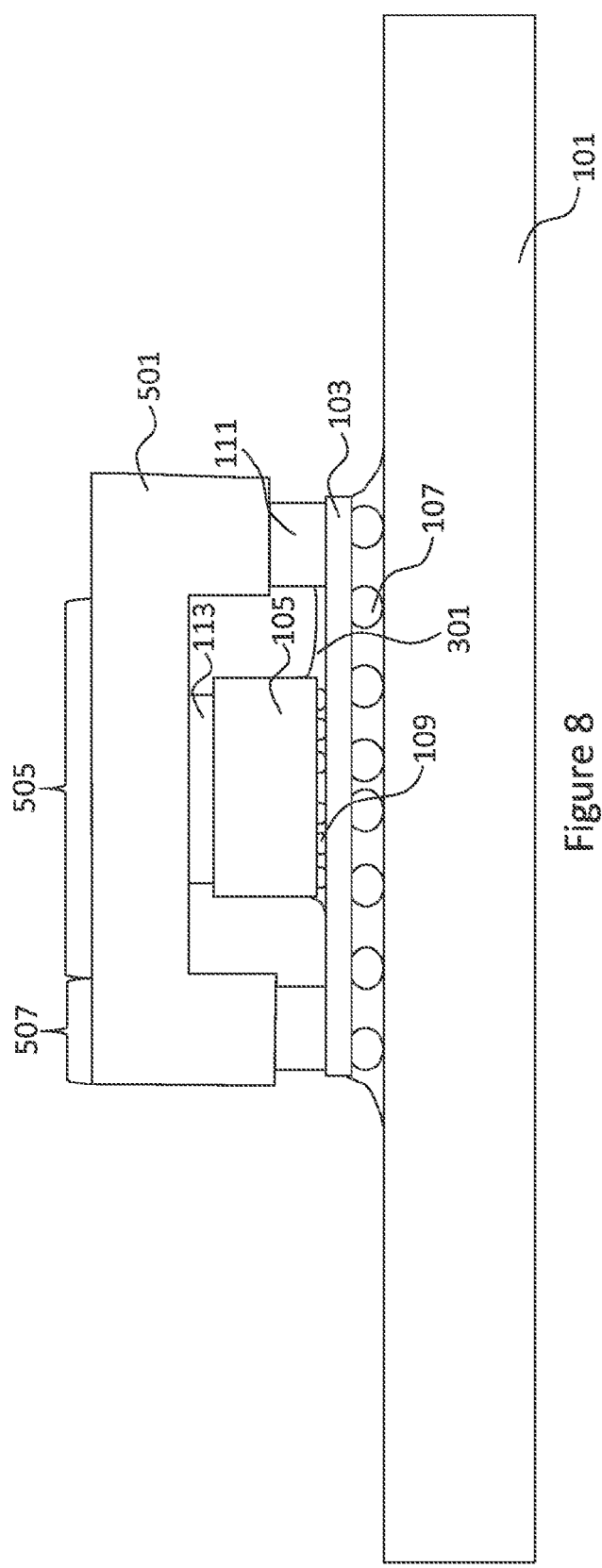
FIGS. 8-9 illustrate further embodiments in which the lid is in contact with the second substrate and the third substrate in accordance with an embodiment.

FIG. 8 illustrates yet another embodiment in which the lid 501, instead of having the first region 505 in contact with the second thermal interface material 113, the second region 507 in contact with the third thermal interface material 401, and the third region 509 in connection with the first substrate 101, the lid 501 only has the first region 505 in contact with the second thermal interface material 113 and the second region 507 in contact with the first thermal interface material 111, with the lid 503 not in contact with the first substrate 101. In this embodiment the first thermal interface material 111 may have, e.g., the fourth thickness $T_4$ in order to bridge the distance between the second substrate 103 and the second region 507 of the lid 501.

Figure 9:
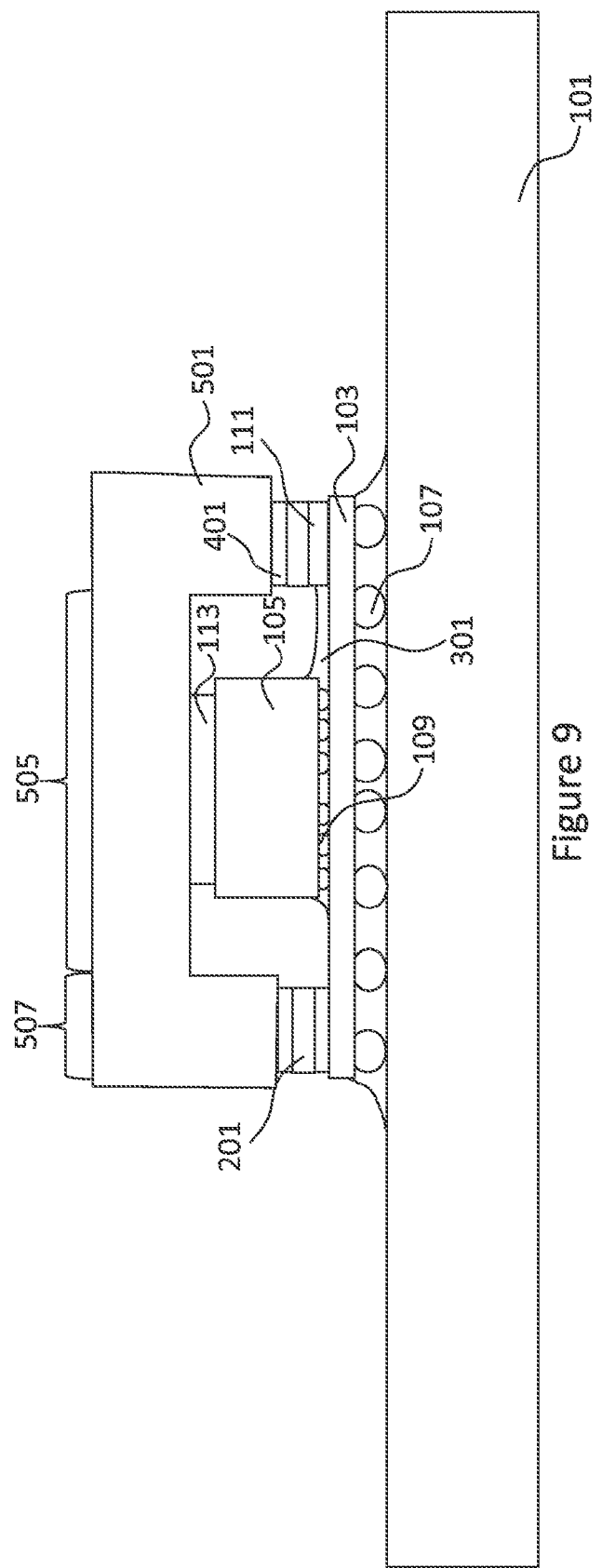

FIG. 9 illustrates yet another embodiment in which the lid 501 retains a similar shape as described above with respect to FIG. 8. However, in this embodiment, rather than increasing the thickness of the first thermal interface material 111 to bridge the distance between the second substrate 103 and the second region 507 of the lid 501, the first thermal interface material 111, the ring 201, and the third thermal interface material 401 are utilized to bridge the distance and provide a thermal path to the lid 501. In this embodiment the first thermal interface material 111, the ring 201, and the third thermal interface material 401 may have the first thickness $T_1$, the second thickness $T_2$, and the third thickness $T_3$, as described above with respect to FIGS. 1-4.

Figure 10:
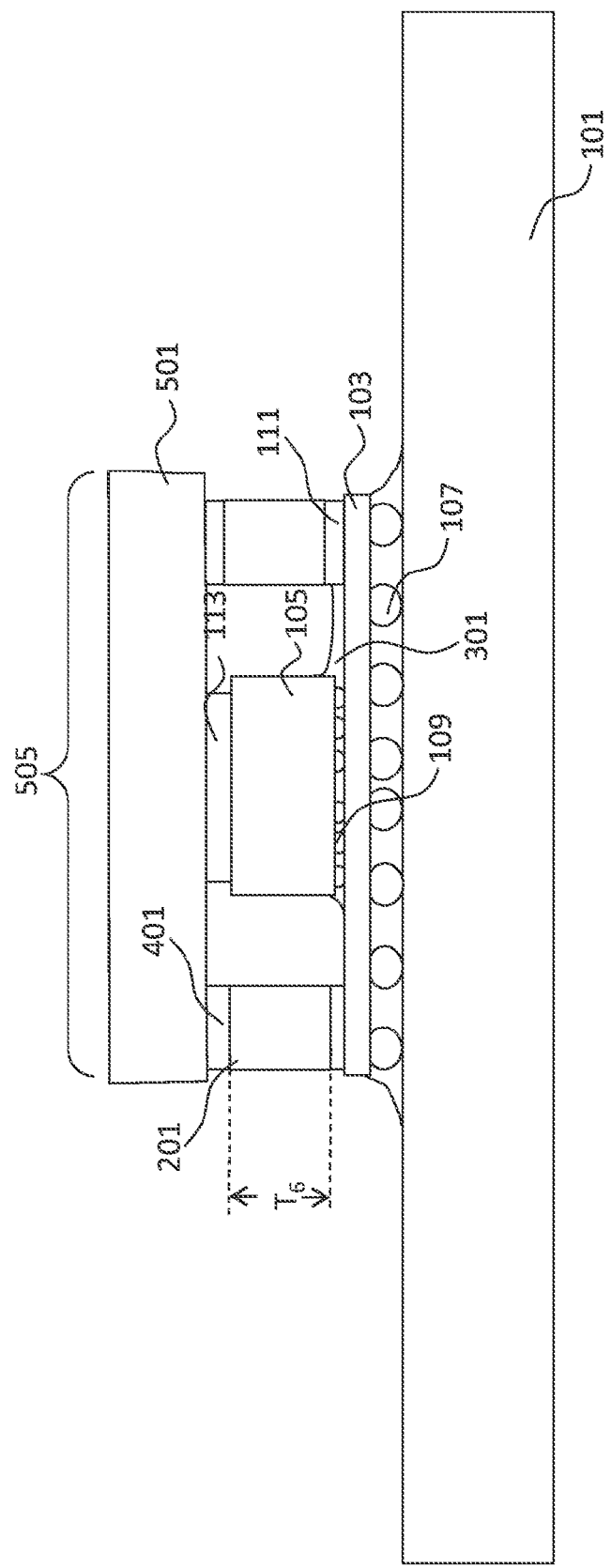
FIG. 10 illustrates another embodiment in which the lid has a constant thickness in accordance with an embodiment.

FIG. 10 illustrates yet another embodiment in which the lid 501 comprises only the first region 505 which has a constant thickness along its length. In this embodiment the thickness of the ring 201 may be expanded in order to bridge the distance between the second substrate 103 and the first region 505 of the lid 501. In an embodiment the ring 201 may have a sixth thickness $T_6$ of between about 0.05 mm and about 5 mm, such as about 1 mm.

Figure 11A:
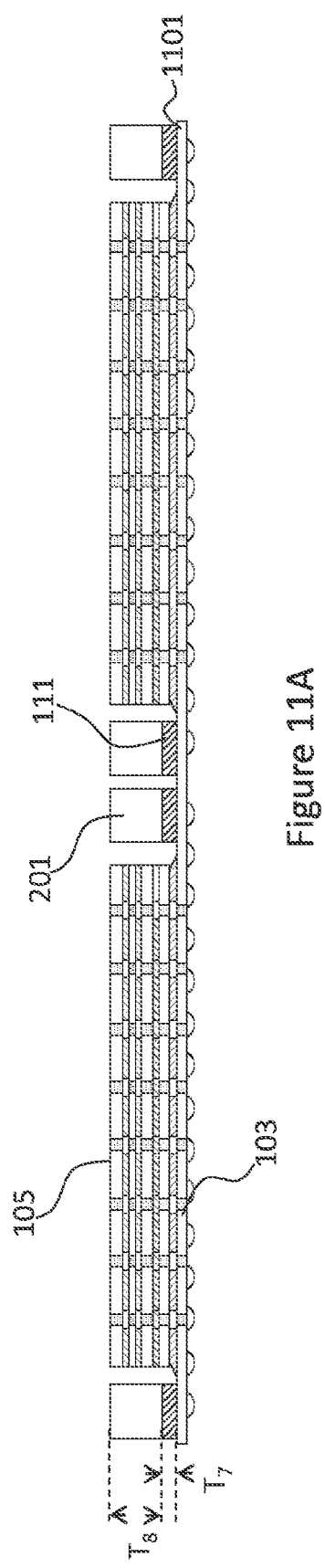
FIGS. 11A-11B illustrate another embodiment in which the thermal interface material and the ring are utilized during a singulation/saw process.
Figure 11B:
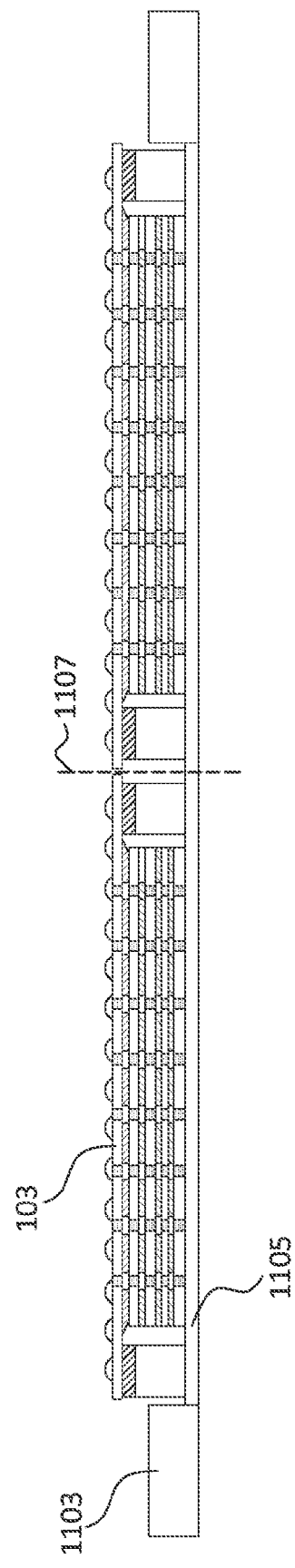

FIGS. 11A-11B illustrate another embodiment in which, prior to being attached to the first substrate 101, the third substrate 105 (which in the embodiment illustrated in FIG. 11A comprises a plurality of semiconductor die) is attached to the second substrate 103 while the second substrate 103 is still attached as part of a semiconductor wafer 1101. In this embodiment the second substrate 103 may have a thickness of about 50 μm while the third substrate 105 may have a plurality of dies that collectively have a thickness of about 300 μm In addition, the first thermal interface material 111 and the ring 201 are disposed on the second substrate prior to the second substrate 103 being singulated from the semiconductor wafer 1101. In particular, the first thermal interface material 111 and the ring 201 have a combined thickness that is at least equal to the third substrate 105. In this embodiment the first thermal interface material 111 may have a seventh thickness $T_7$ of between about 5 μm and about 500 μm, such as about 100 μm, while the ring 201 may have an eighth thickness $T_8$ of between about 0.05 mm and about 5 mm, such as about 1 mm.

FIG. 11B illustrates a singulation of the second substrate 103 from the semiconductor wafer 1101. In an embodiment the third substrate 105 along with the ring 201 are attached to a metal ring 1103 by a carrier tape 1105, such as a UV tape. Once attached, the semiconductor wafer 1101 may be singulated using, e.g., a diamond coated saw (represented in FIG. 11B by the dashed line labeled 1107). However, any suitable method of singulating the second substrate 103 from the semiconductor wafer 1101, such as one or more etching processes, may alternatively be used.

However, by including the first thermal interface material 111 and the ring 201 such that the first thermal interface material 111 and the ring 201 are present during the singulation process, the first thermal interface material 111 and the ring 201 provide additional support to the second substrate 103 during the stresses and strains that occur during the singulation process. This helps to prevent chipping, peeling, and cracks caused by providing an extra siffener ring with a supporting cushion. Such extra support can prevent damage caused by warping and stresses, thereby leading to a higher yield of flip chip bond yields as the mother chip (e.g., the second substrate 103) and the daughter chips (e.g., the third substrate 105) have better warpage with the ring structure present to provide additional support. Once singulated, the second substrate 103 and the third substrate 105 may be bonded to other devices such as the first substrate 101 in, e.g., a flip chip bond arrangement.

In accordance with an embodiment, a method for manufacturing a semiconductor device comprising bonding a first substrate to a first side of a second substrate is provided. A first thermal interface material is placed on the second substrate, wherein the placing the first thermal interface material places the first thermal interface material on the first side. An underfill material is dispensed between the first substrate and the second substrate, the dispensing occurring after the placing the first thermal interface material on the second substrate.

In accordance with another embodiment, a method of manufacturing a semiconductor device comprising dispensing a first thermal interface material onto a first side of a first substrate, wherein a second substrate is bonded to the first side of the first substrate. A ring is placed onto the first thermal interface material, and an underfill material is applied between the first substrate and the second substrate. A lid is attached over the first substrate and the second substrate, the lid being in thermal connection with the ring.

In accordance with yet another embodiment, a semiconductor device comprising a first substrate with a first surface and a second substrate bonded to the first surface is provided. A first thermal interface material is located on the first surface laterally separated from the second substrate, and an underfill material is located between the first substrate and the second substrate, wherein the underfill material extends to the first thermal interface material but does not extend between the first thermal interface material and the first surface.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for manufacturing a semiconductor device, the method comprising:
    bonding a first substrate to a first side of a second substrate;
    placing a first thermal interface material on the second substrate to a thickness of between about 5 μm and about 500 μm, wherein the placing the first thermal interface material places the first thermal interface material on the first side; and
    dispensing underfill material between the first substrate and the second substrate, the dispensing occurring after the placing the first thermal interface material on the second substrate, wherein during the dispensing the underfill material the first thermal interface material is part of a structure with a first exposed surface facing away from the first side, the first exposed surface being located a first distance away from the first side and wherein the first substrate has a second surface facing away from the first side, the second surface being located a second distance away from the first side, the second distance being greater than the first distance, wherein after the dispensing the underfill material the underfill material has a third surface facing away from the second substrate that is in contact with both the first thermal interface material and a sidewall of the first substrate perpendicular to the second substrate, the third surface being closer to second substrate than the second surface.

2. The method of claim 1, further comprising placing a ring onto the first thermal interface material prior to the dispensing the underfill material.

3. The method of claim 2, further comprising curing the first thermal interface material prior to the dispensing the underfill material.

4. The method of claim 2, further comprising dispensing a second thermal interface material onto the ring after the dispensing the underfill material.

5. The method of claim 4, further comprising attaching a lid, wherein the lid is in physical connection with the second thermal interface material.

6. The method of claim 1, further comprising attaching a lid, wherein the lid is in physical connection with the first thermal interface material.

7. The method of claim 1, further comprising bonding the second substrate to a third substrate.

8. A method of manufacturing a semiconductor device, the method comprising:
dispensing a first thermal interface material onto a first side of a first substrate, wherein a second substrate is bonded to the first side of the first substrate prior to the dispensing the first thermal interface material;
placing a ring onto the first thermal interface material, wherein the second substrate extends further from the first substrate than the ring;
applying an underfill material between the first substrate and the second substrate, wherein after the applying the underfill material the underfill material extends in a first direction from a first point to physically contact the first thermal interface material, the first point being between the first substrate and the second substrate, and wherein the underfill material extends in a second direction from the first point only partially towards the first thermal interface material; and
attaching a lid over the first substrate and the second substrate, the lid being in thermal connection with the ring.

9. The method of claim 8, further comprising curing the first thermal interface material after the placing the ring onto the first thermal interface material.

10. The method of claim 8, further comprising bonding the first substrate to a third substrate.

11. The method of claim 8, further comprising dispensing a second thermal interface material onto the ring after the applying the underfill material.

12. The method of claim 11, further comprising dispensing a third thermal interface material onto the second substrate, wherein the attaching the lid over the first substrate and the second substrate further comprises placing the lid in contact with the third thermal interface material.

13. The method of claim 12, wherein the lid has a first region with a first thickness, a second region with a second thickness different from the first thickness, and a third region with a third thickness different from the first thickness and the second thickness, wherein the first region is in contact with the third thermal interface material, the second region is in contact with the second thermal interface material, and the third region is in contact with an adhesive on a third substrate.

14. The method of claim 8, wherein the lid has a constant thickness along its length.

15. A method of manufacturing a semiconductor device, the method comprising:
bonding a first substrate to a second substrate, wherein the first substrate comprises a first section that laterally extends beyond the second substrate;
bonding a third substrate to the second substrate, wherein the second substrate comprises a second section that laterally extends beyond the third substrate;
placing a first thermal interface material on the second substrate in the second section;
dispensing a first underfill material between the second substrate and the third substrate after the placing the first thermal interface material, wherein the first thermal interface material prevents the first underfill material from flowing in the first direction and wherein at an end of the dispensing the first underfill material the first underfill material contacts the first thermal interface material at a point that is located a first distance away from the first substrate, the first thermal interface material extending away from the first substrate a second distance greater than the first distance; and
placing a lid in thermal connection with the first thermal interface material, the third substrate, and the first section of the first substrate, wherein the lid has a first thickness over the first section of the first substrate, a second thickness different from the first thickness over the first thermal interface material, and a third thickness different from the first thickness and the second thickness over the third substrate.

16. The method of claim 15, further comprising placing a second thermal interface material on the third substrate prior to the placing the lid.

17. The method of claim 15, further comprising placing a ring over the first thermal interface material prior to the placing the lid.

18. The method of claim 17, further comprising placing a third thermal interface material on the ring prior to the placing the lid, wherein the lid is in physical contact with the third thermal interface material.

19. The method of claim 15, wherein the placing the lid further comprises placing a heat sink.

20. The method of claim 15, further comprising curing the first thermal interface material after the placing the first thermal interface material.

* * * * *